US010355646B2

(12) United States Patent
Lee et al.

(10) Patent No.: US 10,355,646 B2
(45) Date of Patent: Jul. 16, 2019

(54) POWER AMPLIFIER FOR MILLIMETER WAVE DEVICES

(71) Applicant: GLOBALFOUNDRIES INC., Grand Cayman (KY)

(72) Inventors: See Taur Lee, Richardson, TX (US); Abdellatif Bellaouar, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/967,172

(22) Filed: Apr. 30, 2018

(65) Prior Publication Data

US 2019/0190453 A1   Jun. 20, 2019

Related U.S. Application Data

(60) Provisional application No. 62/608,530, filed on Dec. 20, 2017.

(51) Int. Cl.
*H03F 1/02*  (2006.01)
*H03F 3/21*  (2006.01)
(Continued)

(52) U.S. Cl.
CPC ........... *H03F 1/0205* (2013.01); *H03F 3/193* (2013.01); *H03F 3/21* (2013.01); *H03F 3/45165* (2013.01);
(Continued)

(58) Field of Classification Search
CPC .................................................... H03F 1/0205
See application file for complete search history.

(56) References Cited

U.S. PATENT DOCUMENTS 5,576,647 A * 11/1996 Sutardja ............... H03K 3/0231
327/108
6,026,286 A *  2/2000 Long ..................... H03D 7/1433
455/319

(Continued)

OTHER PUBLICATIONS

Ji. Li, et al.; A 50-59 GHz CMOS Injection Locking Power Amplifier; IEEE Microwave and Wireless Components Letters; vol. 25, No. 1; Jan. 2015; pp. 52-54.

(Continued)

*Primary Examiner* — Patricia T Nguyen
(74) *Attorney, Agent, or Firm* — Williams Morgan, P.C.

(57) ABSTRACT

We disclose apparatus which may provide power amplification in millimeter-wave devices with reduced size and reduced power consumption, and methods of using such apparatus. One such apparatus comprises an input transformer; a first differential pair of injection transistors comprising a first transistor and a second transistor; a first back gate voltage source configured to provide a first back gate voltage to the first transistor; a second back gate voltage source configured to provide a second back gate voltage to the second transistor; a second differential pair of oscillator core transistors comprising a third transistor and a fourth transistor, wherein the third transistor and the fourth transistor are cross-coupled; a third back gate voltage source configured to provide a third back gate voltage to the third transistor; a fourth back gate voltage source configured to provide a fourth back gate voltage to the fourth transistor; and an output transformer.

18 Claims, 8 Drawing Sheets

(51) Int. Cl.
H03F 3/193 (2006.01)
H03F 3/45 (2006.01)
H04B 1/04 (2006.01)

(52) U.S. Cl.
CPC ......... *H04B 1/04* (2013.01); *H03F 2200/451* (2013.01); *H03F 2200/534* (2013.01); *H03F 2200/541* (2013.01); *H04B 2001/0408* (2013.01)

(56) References Cited

U.S. PATENT DOCUMENTS

| | | | | |
|---|---|---|---|---|
| 7,301,398 | B1* | 11/2007 | Allott | H03F 1/26 |
| | | | | 330/253 |
| 8,554,162 | B2 | 10/2013 | Lindstrand et al. | |
| 9,197,221 | B2* | 11/2015 | Babaie | H03B 1/00 |
| 2006/0006945 | A1* | 1/2006 | Burns | H03F 3/211 |
| | | | | 330/295 |
| 2008/0106335 | A1* | 5/2008 | Kimura | H03F 1/3211 |
| | | | | 330/253 |
| 2012/0064836 | A1* | 3/2012 | Bauwelinck | H03F 1/223 |
| | | | | 455/73 |
| 2018/0367097 | A1* | 12/2018 | Martineau | H03B 5/1212 |

OTHER PUBLICATIONS

Y. H. Chee, et al.; "An Ultra-Low-Power Injection Locked Transmitter for Wireless Sensor Networks", IEEE JSSC, vol. 41, No. 8, Aug. 2006; pp. 1740-1748.

* cited by examiner

POWER AMPLIFIER FOR MILLIMETER WAVE DEVICES

BACKGROUND OF THE INVENTION

Field of the Invention

Generally, the present disclosure relates to sophisticated semiconductor devices, and, more specifically, to power amplifiers for millimeter wave devices.

Description of the Related Art

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (WiGig) devices,), etc. Radar devices have been implemented in various applications such as vehicle safety and automation applications.

Implementing mm-wave applications produces many challenges when designing circuits for these applications, special consideration is to be given to designing power amplifiers. Power amplification is a necessity in essentially all electronic devices, including mm-wave devices. In light of the ongoing race to reduce device sizes and/or power consumptions, known power amplifiers have undesirably high power consumption and undesirably large size for use in contemporary devices. These problems are particularly pronounced for millimeter wave devices, such as vehicular radar devices, 5G telecommunication devices, and the like.

Attempts to improve power amplifiers have included various injection locked power amplifiers. Designers have pursued injection locking designs in in prior art devices by implementing multiple programmable current sources in order to adjust the injection current in such implementations. Further, designers have implemented AC coupling techniques to decouple DC to the inductor of an output transformer. However, providing multiple programmable current sources consumes a relatively large amount of power and leads to upconversion of noise provided by the multiple programmable current sources. AC coupling reduces the power amplification of the circuit, thereby requiring greater input power to generate a desired output power level.

It would be desirable to have a power amplifier that may allow one or more of reduced size, reduced power consumption, or increased operating frequency.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to an apparatus, comprising: an input transformer; a first differential pair of injection transistors comprising a first transistor and a second transistor; a first back gate voltage line configured to provide a first back gate voltage to the first transistor; a second back gate voltage line configured to provide a second back gate voltage to the second transistor; a second differential pair of oscillator core transistors comprising a third transistor and a fourth transistor, wherein the third transistor and the fourth transistor are cross-coupled; a third back gate voltage line configured to provide a third back gate voltage to the third transistor; a fourth back gate voltage line configured to provide a fourth back gate voltage to the fourth transistor; and an output transformer.

In one embodiment, the present disclosure is directed to a method, comprising: determining a difference between a first power of a first component of a differential output of a power amplifier comprising oscillator core transistors, and a second power of a second component of the differential output; adjusting a back gate voltage of a first oscillator core transistor, in response to the first power and the second power differing by equal to or greater than a first threshold; setting the back gate voltage of the first oscillator core transistor to a default value, in response to the back gate voltage being adjusted to a maximum value; re-determining a difference between the first power and the second power, in response to the back gate voltage of the first oscillator core transistor being set to the default value; and changing a back gate voltage of a second oscillator core transistor, in response to a re-determined difference between the first power and the second power being equal to or greater than a second threshold.

In one embodiment, the present disclosure is directed to a manufacturing system, configured to manufacture an apparatus, such as is described above.

Embodiments herein may provide power amplifier circuits with one or more of reduced size, reduced power consumption, or increased operating frequency.

BRIEF DESCRIPTION OF THE DRAWINGS

The disclosure may be understood by reference to the following description taken in conjunction with the accompanying drawings, in which like reference numerals identify like elements, and in which.

Figure 1:
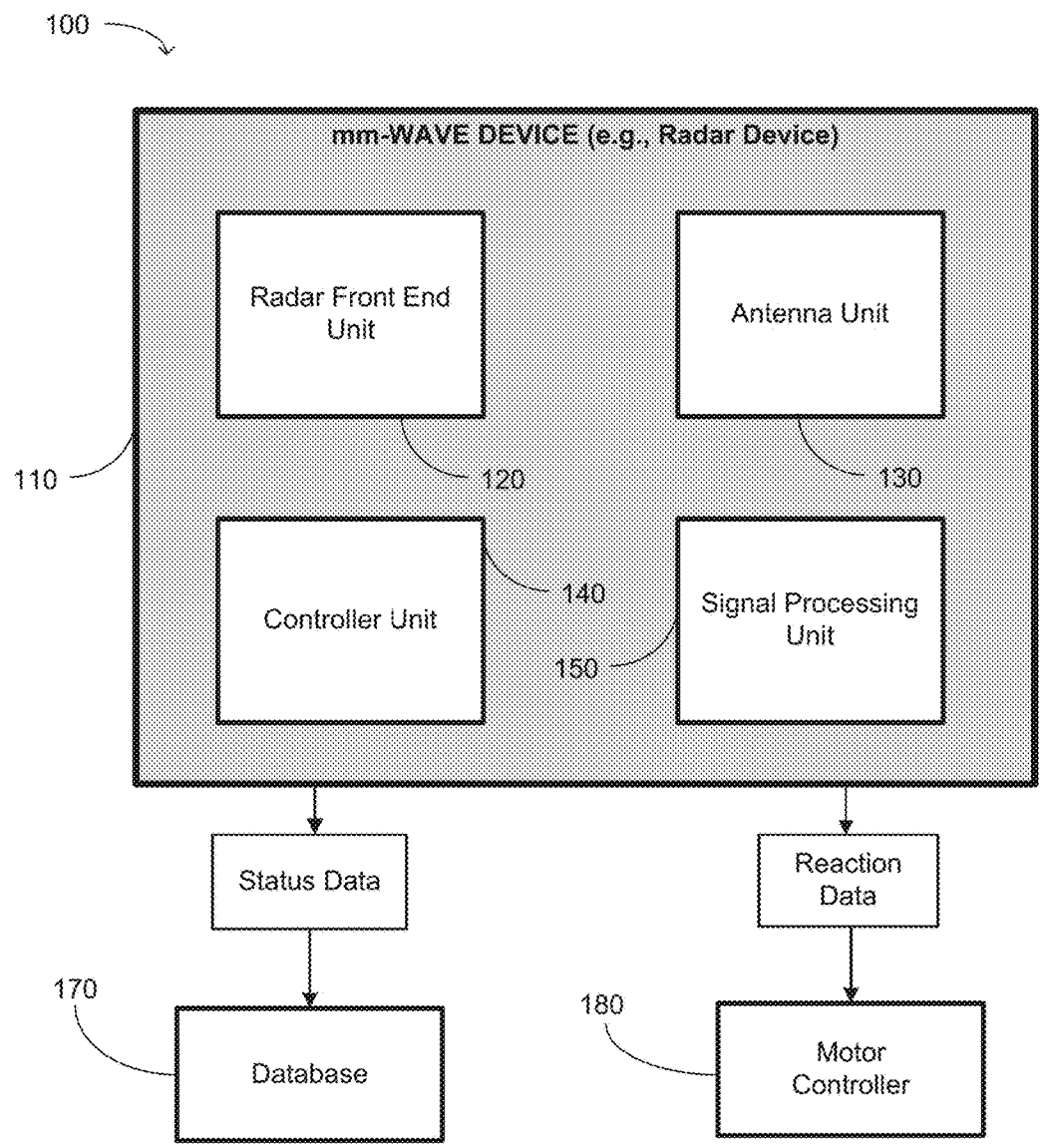
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for millimeter wave (mm-wave) power amplifiers with one or more of lower size, lower power consumption, and/or improved symmetry of outputs. Embodiments herein call for utilizing back gate biasing of one or more transistors to improve performance of mm-wave power amplifiers. Embodiments herein call for using back gate biasing for tuning an injection current, as well as an oscillator core current, wherein these tuning are performed in an independent fashion.

Further, both portions of differential pair amplifiers of embodiments herein may be tuned independently by controlling the back gate voltages of those portions. In this manner, smaller devices may be used for performing power amplification, reducing input load, and thereby, reducing power consumption and allowing for higher operating frequencies, which are features that are helpful in mm-wave applications. The back gate biasing of embodiments herein may be implemented into semiconductor devices of varying technology that allows for back gate biasing of transistors, e.g., fully depleted silicon-on-insulator (FDSOI) devices.

For ease of illustration, embodiments herein is depicted within the context of a radar device, however, those skilled in the art would readily appreciate that the concepts disclosed herein may be implemented in other types of devices, such as high-speed communication devices, network devices, high-definition video devices, etc. Turning now to FIG. 1, a stylized block diagram representation of a mm-wave system, in accordance with embodiments herein, is illustrated.

A system 100 may comprise an mm-wave device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a radar application; as such, the mm-wave device 110 may also be referred to below as a radar device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The radar device 110 is capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may control operations of one or more motors. Examples of motors may include devices that performing braking functions, steering functions, gear-shifting functions, accelerating functions, warning functions, and/or other actions relating to the operations of a road vehicle, an aircraft, and/or a watercraft. The motor controller 180 may use the reaction data and/or the status data to perform these control functions. The motor controller 180 may comprise one or more controllers that are capable of controlling a plurality of devices that perform the various operations of a road vehicle, an aircraft, and/or a watercraft.

The radar device 110 may comprise a radar front end unit 120, an antenna unit 130, a controller unit 140, and a signal processing unit 150. The radar front end unit 120 may comprise a plurality of components, circuit, and/or modules, and is capable of sending, receiving, processing, and reacting to radar signals. In one embodiment, the radar device 110 may be encompassed into a single integrated circuit (IC) chip. In some embodiments, the radar device 110 may be formed on a plurality of integrated circuits that are positioned on a single IC chip. In other embodiments, radar device 110 may be formed on single integrated circuit, which is shrouded into an IC chip.

The radar front end unit 120 is capable of providing a radar signal. In one embodiment, the frequency range of the radar signals processed by the radar device 110 may be in the range of about 10 GHz to about 90 GHz. The radar front end unit 120 is capable of generating a radar signal at a predetermined frequency range and directing the radar signal at a predetermined target area. The radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the radar front end unit 120 is provided in FIG. 3 and accompanying description below.

In an alternative embodiment, the 120 may be a network communications front end unit, instead of a radar front end unit. In this embodiment, instead of receiving, transmitting, and/or processing radar signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the radar device 110 may also comprise a signal processing unit 150. The signal processing unit is capable of performing various analog and/or digital processing of the signals that are transmitted and/or received by the radar device 110. For example, the radar signal sent transmitted by the radar device may be amplified prior to its transmission. Further, the reflected signal received by the radar device 110 may be sent through one or more analog filter stages. The reflected signals may then be converted to a digital signal by one or more analog-to-digital converters (ADC) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the radar device 110. These functions include generating a radar signal, transmitting the radar signal, receiving a reflected signal, processing the reflected signal, and perform one or more determinations of the location, direction, speed, etc. of a target based on the reflected signal. The controller unit 140 is capable of generating the status data and the reaction data described above.

Figure 2:
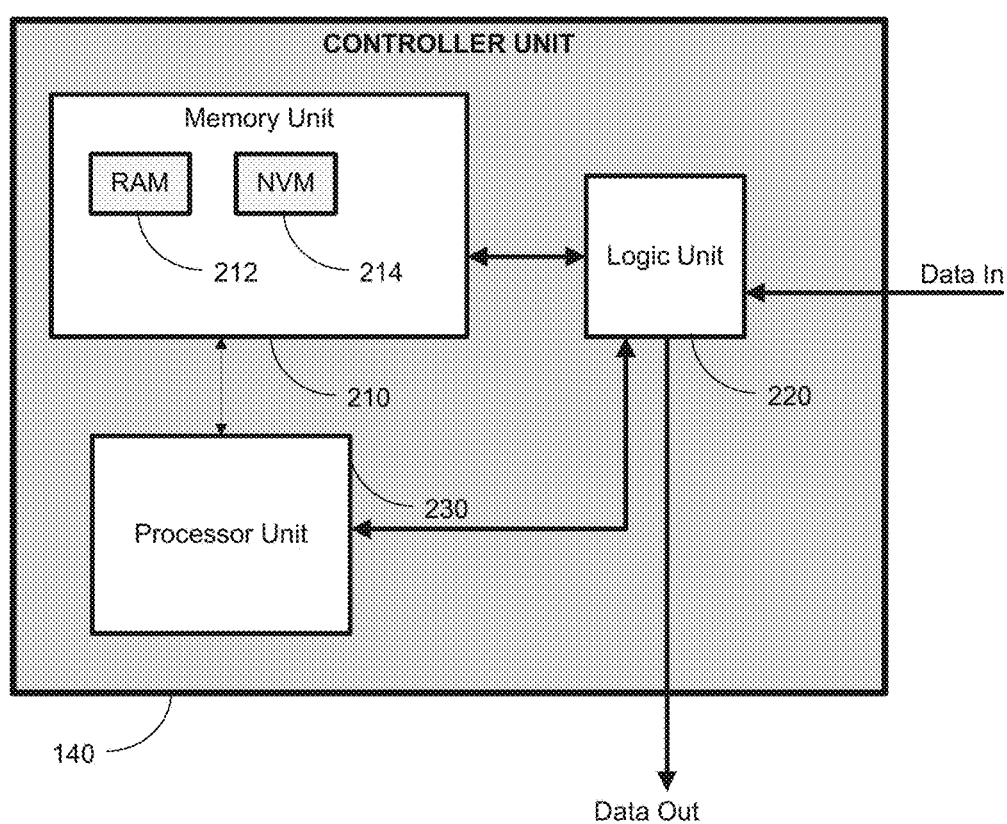
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing the reflected signal. The data_out signal may represent data generated for performing one or more tasks as a result of the radar signal transmission and the reflected signal. For example, the data_out signal may be used to perform an action based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the radar device 110. Further, the memory unit 210 may store the status data and the reaction data described above. The memory unit 210 may also store data that may be used to program any FPGA devices in the radar device 110. As such, the memory unit 210 may be subdivided into a program data memory, a status data memory, and a reaction data memory. This subdivision may be performed logically, or physically.

Figure 3:
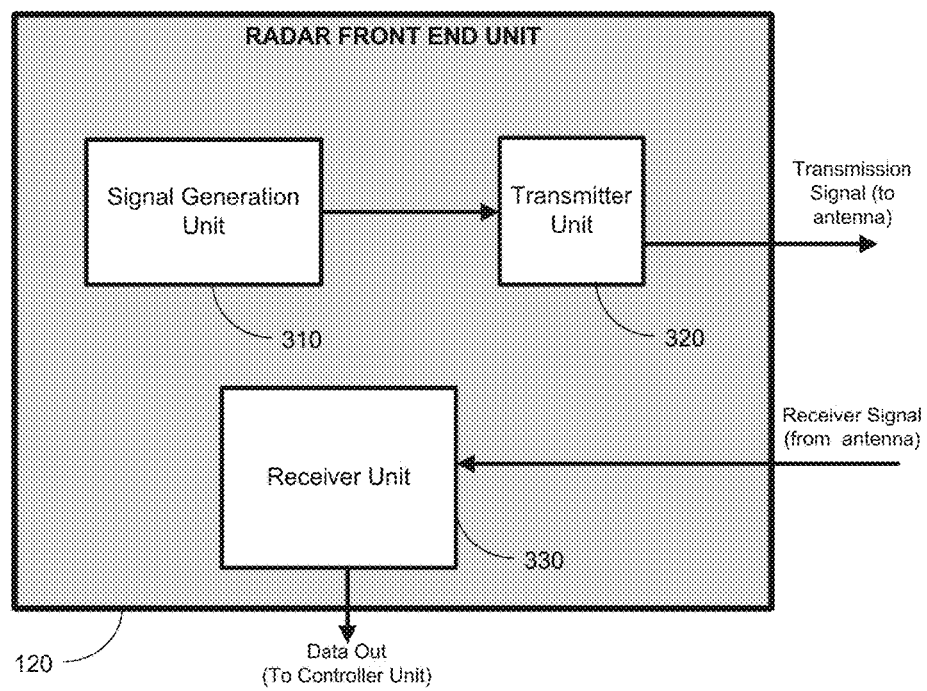
FIG. 3 illustrates a stylized block diagram depiction of the radar front end unit of FIG. 1, in accordance with embodiments herein, is illustrated.

Turning now to FIG. 3, a stylized block diagram depiction of the radar front end unit 120, in accordance with embodiments herein, is illustrated. The radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 may comprise a true differential frequency doubler (FD). The FD may be formed in a push-push configuration. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

Figure 4:
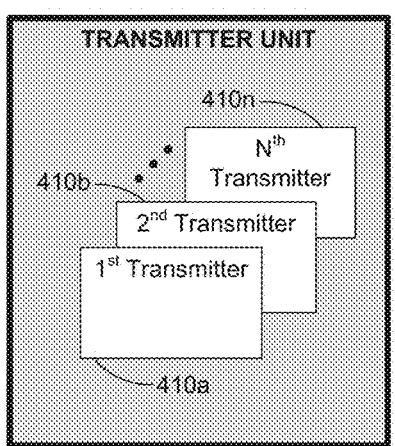
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410$a$, a $2^{nd}$ transmitter 410$b$, through an $N^{th}$ transmitter 410$n$ (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410.

For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., reflected signal resulting from a reflection of the radar signal from a target) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing data_out to the controller unit 140.

Figure 5:
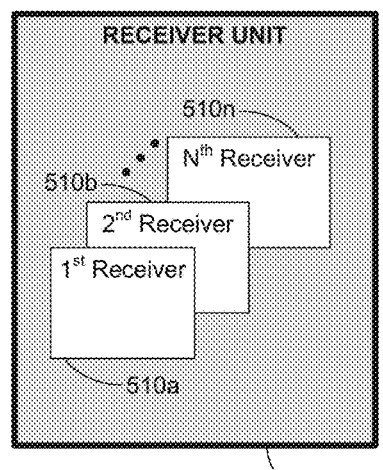
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, the antenna unit 130 may provide a plurality of signals to the $1^{st}$ through $N^{th}$ receiver 510. For example, the antenna unit 130 may provide a signal to each receiver 510, or alternatively, a $1^{st}$ receiver signal for a first set of receivers 510 and a $2^{nd}$ receiver signal for a second set of receivers 510.

Figure 6:
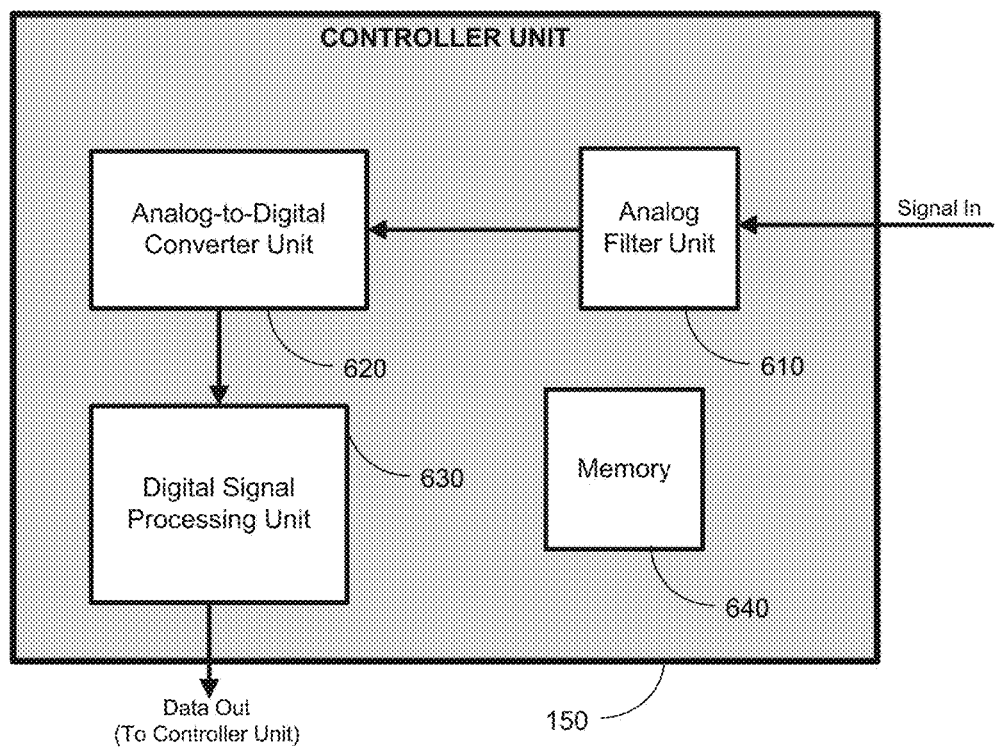
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 640 may be a first-in-first-out (FIFO) memory. In other cases, the processed digital output from the DSP unit 630 may be stored in the memory unit 210 of the controller unit 140.

Figure 7:
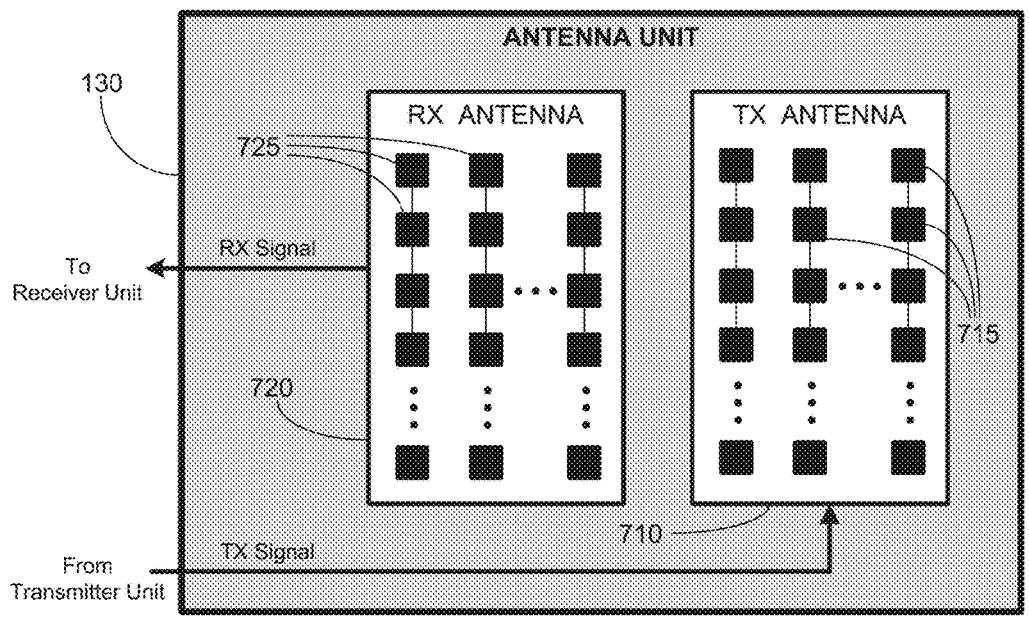
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
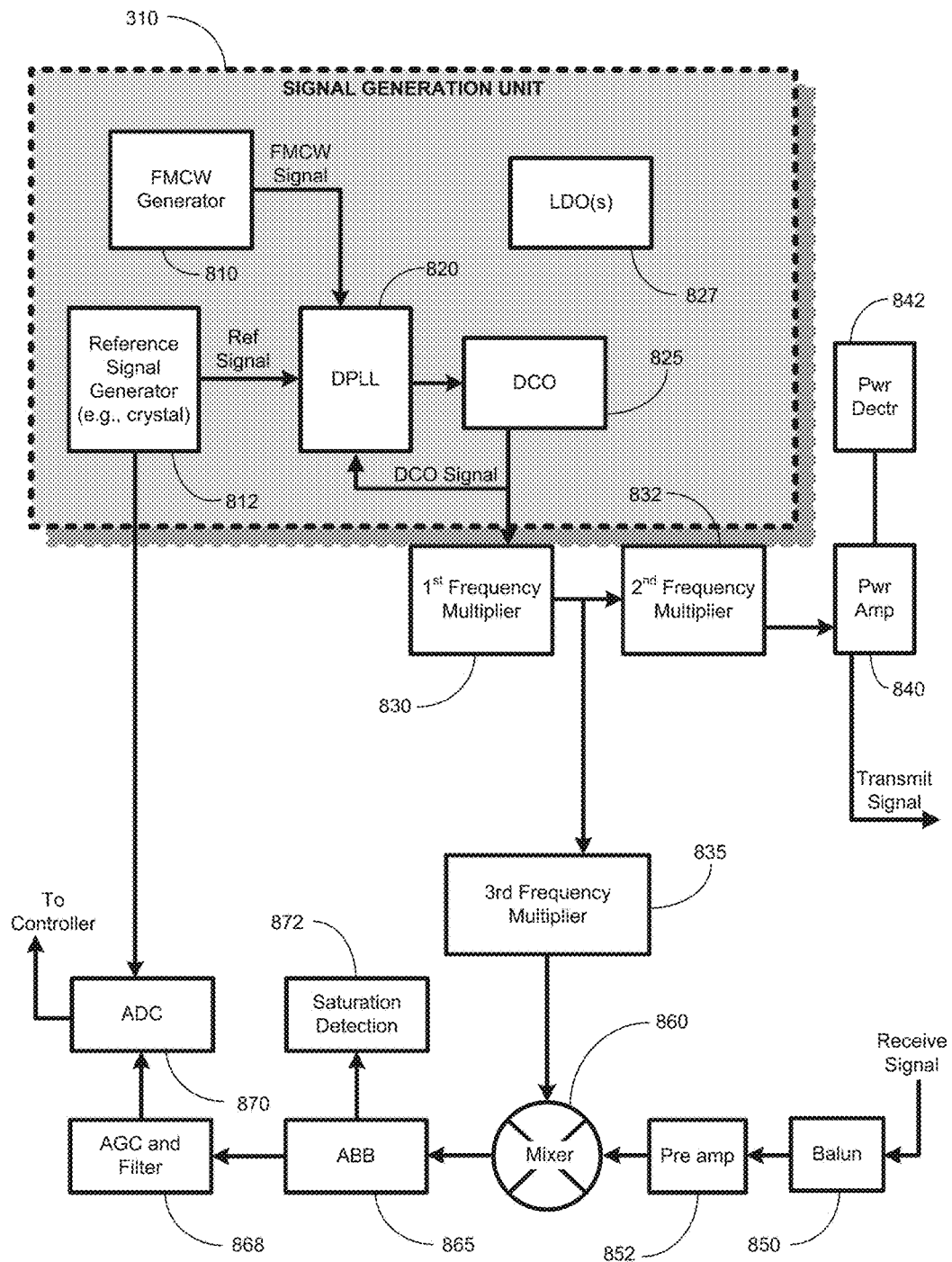
FIG. 8 illustrates a stylized block diagram depiction of an exemplary radar application of the system of FIG. 1, in accordance with embodiments herein.

Turning now to FIG. 8, a stylized block diagram depiction of an exemplary radar application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a $1^{st}$ frequency multiplier 830 is used to double the 20 GHz signal to produce a 40 GHz signal. A $2^{nd}$ frequency multiplier 832 is used to double the 40 GHz signal to produce an 80 GHz signal. The output of the $2^{nd}$ frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a 3$^{rd}$ frequency multiplier 835. The output of the 3$^{rd}$ frequency multiplier 835 is the doubled version of the 40 GHz signal from the 1$^{st}$ frequency multiplier. That is, the output of the 3$^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

Each of the 1$^{st}$, 2$^{nd}$, and 3$^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

Figure 9:
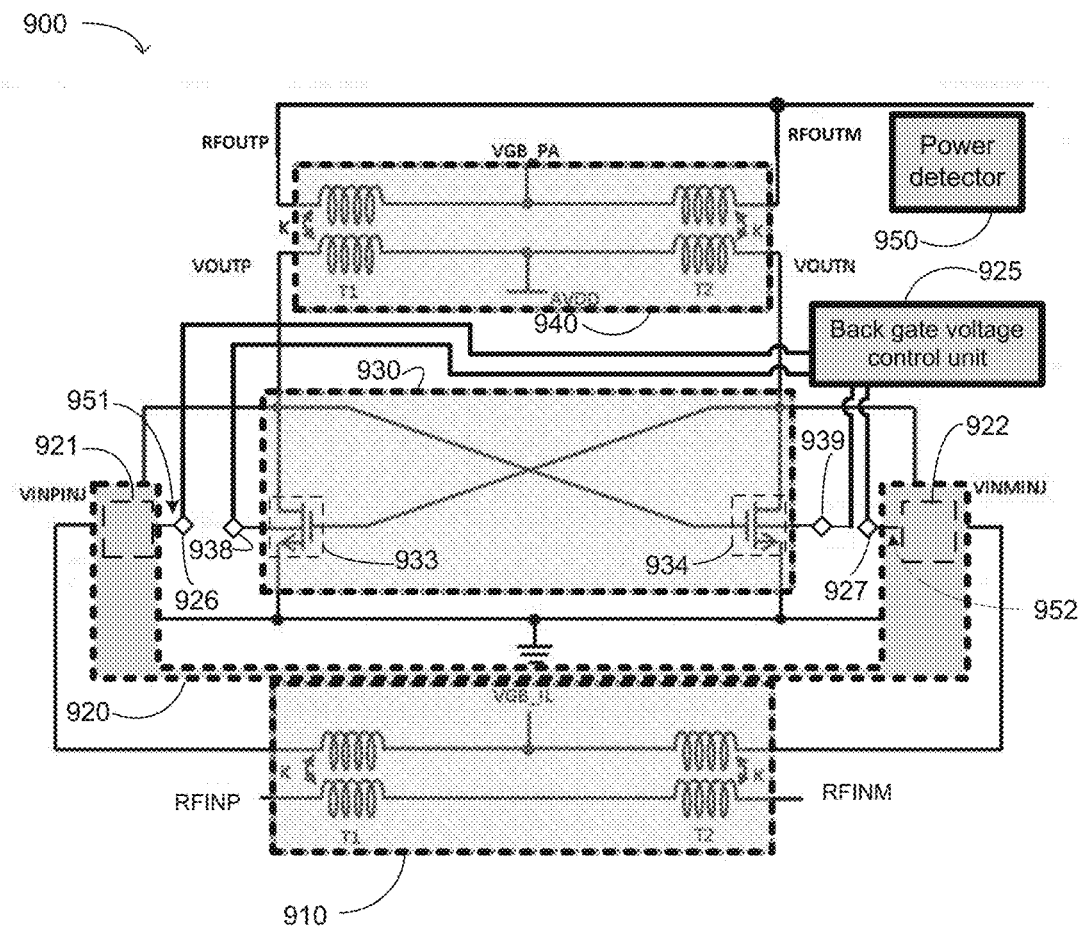
FIG. 9 illustrates a power amplifier circuit, in accordance with embodiments herein.
Figure 10:
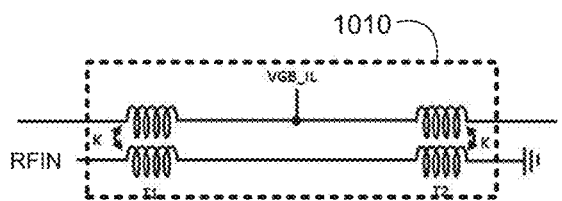
FIG. 10 illustrates an input transformer, in accordance with embodiments herein.

FIG. 9 depicts a power amplifier circuit 900, in accordance with embodiments herein. The power amplifier circuit 900 may be implemented into various circuitry associated with the signal generation unit 310 (FIG. 3). The power amplifier circuit 900 may operate from any desired power supply voltage AVDD. In one embodiment, the power amplifier circuit 900 may operate from a 0.5 V power supply. The power amplifier circuit 900 comprises an input transformer 910. As depicted in FIG. 9, the input transformer 910 may be differential transformer, receiving input signals RFINP and RFINM. In other embodiments, a single-ended input may be utilized. FIG. 10 shows a single-ended input transformer 1010 (receiving input signal RFIN) that may be substituted for the differential input transformer 910 in various embodiments of the power amplifier circuit 900. Whether single-ended or differential, the input transformer 910 or 1010 may provide a differential signal to other elements of the power amplifier circuit 900.

The power amplifier circuit 900 also comprises a first differential pair 920 of injection transistors having a first transistor 921 and a second transistor 922. As depicted, one end (+ or "P") of the differential signal provided by the input transformer 910 or 1010 controls the gate of the first transistor 921 and the other end (- or "M") of the differential signal provided by the input transformer 910 or 1010 controls the gate of the second transistor 922.

The first transistor 921 and the second transistor 922 may be any field effect transistors (FETs), such as metal-oxide-semiconductor FETs (MOSFETs), provided the architecture of the first and second transistors 921, 922 contains a back gate. In one embodiment, the first transistor 921 may be a fully depleted silicon-on-insulator (FDSOI) transistor. Alternatively or in addition, the second transistor 922 may be an FDSOI transistor. In another embodiment, the first transistor 921, the second transistor 922, or both may be a deep n-well transistor.

As depicted, the first transistor 921 and the second transistor 922 may be NMOS transistors, though in other embodiments (not shown), the first transistor 921, and the second transistor 922 may be PMOS transistors. The first and second transistors 921, 922 each comprise a back gate node, which may be used to perform back gate biasing of the transistors 921, 922.

The power amplifier circuit 900 also comprises a first back gate voltage source 926 configured to provide a first back gate voltage to a back gate 951 of the first transistor 921. The power amplifier circuit 900 additionally comprises a second back gate voltage source 927 configured to provide a second back gate voltage to a back gate 952 of the second transistor 922. In some embodiments (not shown), a single voltage source may serve as both the first back gate voltage source 926 and the second back gate voltage source 927.

In one embodiment, the first back gate voltage source 926 and the second back gate voltage source 927 are each capable of providing a range of voltages to the back gates of the first transistor 921 and the second transistor 922. These voltages may be set in a predetermined fashion, and/or alternatively, may be programmed or changed dynamically. For example, the first back gate voltage source 926 and the second back gate voltage source 927 may be changed to alter the injection current provided by the first differential pair 920 of injection transistors. (In other embodiments, the injection current provided by the first differential pair 920 of injection transistors may be changed by modifying the voltage VGB_IL, as will be known to the person of ordinary skill in the art). Alternatively or in addition, the first back gate voltage source 926 and the second back gate voltage source 927 may be changed to alter the lock-in range of the first differential pair 920 of injection transistors. At or near lock-in, the first back gate voltage source 926 and the second back gate voltage source 927 may be reduced to minimize power consumption of the power amplifier circuit 900.

The first back gate voltage source 926 and the second back gate voltage source 927 may provide the same voltage to the back gates of both transistors 921 and 922, respectively, or they may provide different voltages to the back gates of both transistors 921 and 922, respectively. In embodiments wherein different voltages are provided to the back gates of the first transistor 921 and the second transistor 922, the voltages may be adjusted to balance the amplitudes of the two ends of the differential output.

The first transistor 921 may have its gate controlled by the P end of the differential signal from the input transformer 910 or 1010 and may provide a P end of the differential signal to other components of the power amplifier circuit 900. The second transistor 922 may have its gate controlled by the M end of the differential signal from the input transformer 910 or 1010 and may provide an M end of the differential signal to other components of the power amplifier circuit 900.

The power amplifier circuit 900 depicted in FIG. 9 also includes a second differential pair 930 of oscillator core transistors comprising a third transistor 933 and a fourth transistor 934. Generally, the first differential pair 920 of injection transistors locks the frequency of the second differential pair 930 of oscillator core transistors to the frequency of the differential signal carried on VINPINJ and VINMINJ. In the second differential pair 930, the third transistor 933 and the fourth transistor 934 are cross-coupled, by which is meant the third transistor 933 has its gate controlled by one end (e.g. M) of the differential signal provided by the first differential pair 920 and provides the other end (e.g., P) of the differential signal to other components of the power amplifier circuit 900, and the fourth transistor 934 has its gate controlled by the opposite end (e.g. P) of the differential signal provided by the first differential pair 920 and provides the opposite end (e.g., M) of the differential signal to other components of the power amplifier circuit 900.

The third transistor 933 and the fourth transistor 934 may be conventional FETs, such as MOSFETs, provided the architecture of the third and fourth transistors 933, 934 contains a back gate. In one embodiment, the third transistor 933 and the fourth transistor 934 may each be an FDSOI transistor. In another embodiment, the third transistor 933, the fourth transistor 934, or both may be a deep n-well transistor.

As depicted, the third transistor 933 and the fourth transistor 934 may be NMOS transistors, though in other embodiments (not shown), the third transistor 933 and the fourth transistor 934 may be PMOS transistors.

The power amplifier circuit 900 comprises a third back gate voltage source 938 configured to provide a third back gate voltage to the third transistor 933, and also comprises a fourth back gate voltage source 939 configured to provide a fourth back gate voltage to the fourth transistor 934. In some embodiments (not shown), a single voltage source may serve as both the third back gate voltage source 938 and the fourth back gate voltage source 939.

In one embodiment, the third back gate voltage source 938 and the fourth back gate voltage source 939 are each capable of providing a range of voltages to the back gates of the third transistor 933 and the fourth transistor 934. For example, the third back gate voltage source 938 and the fourth back gate voltage source 939 may be used to increase the current of the second differential pair 930 and accordingly increase the output power of the power amplifier circuit 900. Alternatively or in addition, the third back gate voltage source 938 and the fourth back gate voltage source 939 may be adjusted to compensate for current fluctuations through the second differential pair 930, which may arise from manufacturing variations in one or more components of the power amplifier circuit 900, the operating temperature, or other sources of current fluctuation known to the person of ordinary skill in the art.

The third back gate voltage source 938 and the fourth back gate voltage source 939 may provide the same voltage to the back gates of the transistors 933 and 934, respectively. The third back gate voltage source 938 and the fourth back gate voltage source 939 may provide different voltages to the back gates of the transistors 933 and 934, respectively. In embodiments wherein different voltages are provided to the back gates of the third transistor 933 and the fourth transistor 934, the voltages may be adjusted to balance the amplitudes of the two ends of the differential output.

The power amplifier circuit 900 further comprises a back gate voltage control unit 925. The back gate voltage control unit 925 comprises circuitry whereby the voltage provided by each back gate voltage source 926, 927, 938, and 939 to the back gate of the first through fourth transistors 921, 922, 933, and 934 may be adjusted according to operator input or the output of an algorithm, such as an algorithm represented by the flowchart of FIG. 12. By providing different and controllable back gate voltages to both the first differential pair 920 (the injection transistors) and the second differential pair 930 (the oscillator core), the ratio of injection current to oscillator current can be kept at a constant value. By providing different and controllable back gate voltages to both the first transistor 921 and the second transistor 922, or to both the third transistor 933 and the fourth transistor 934, one or more of the various desirable properties described above for the power amplifier circuit 900 may be improved.

In some embodiments, the back gate voltage sources 926, 927, 938, and 939 may be located proximate the circuit 900. The back gate voltage sources 926, 927, 938, and 939 may be electrically coupled to the first through fourth transistors 921, 922, 933 934 via respective back gate voltage lines, as exemplified in FIG. 9. In other embodiments, the back gate voltage sources may be in a separate location from the circuit 900. For example, the circuit 900 may be on a first chip, while the back gate voltage sources 926, 927, 938, and 939 may be located on a separate, second chip, electrically coupled to the first through fourth transistors 921, 922, 933, 934 via respective back gate voltage lines (as shown in FIG. 9) through input/output pins of the first and second chips. (not shown).

Figure 11:
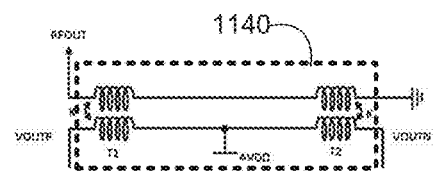
FIG. 11 illustrates an output transformer, in accordance with embodiments herein.

The power amplifier circuit 900 also comprises an output transformer 940. As depicted in FIG. 9, the output transformer 940 may be a differential transformer, providing output signals RFOUTP and RFOUTM. In an alternative embodiment, a single ended output may be provided using a single ended output transformer. FIG. 11 shows a single-ended output transformer 1140 (providing output signal RFOUT) that may be substituted for the output transformer 940 in various embodiments of the power amplifier circuit 900.

Whether single-ended or differential, the output transformer 940 or 1140 provides an output signal to subsequent stages of a device comprising the power amplifier circuit 900. Such a device may be a millimeter-wave radar device, a 5G telecommunications device, a high-definition video device, or the like as referred to above.

In one embodiment, wherein the output transformer 940 provides a differential output, the power amplifier circuit 900 may comprise a power detector 960. The power detector 960 may be configured to detect the power on each end of the differential output provided by the output transformer 940. Alternatively or in addition, the power detector 960 may be configured to measure or determine only the difference between the powers on each end of the differential output provided by the output transformer 940. The power detector 960 may be configured to detect leakage only and may lack direct physical connection to the lines carrying RFOUTP and RFOUTM from the output transformer 940. In some embodiments, based on a signal from the power detector 960, one or more adjustments may be made in the operation of the circuit 900, e.g., adjustment of the voltage applied to one or more of the back gates described above.

Figure 12:
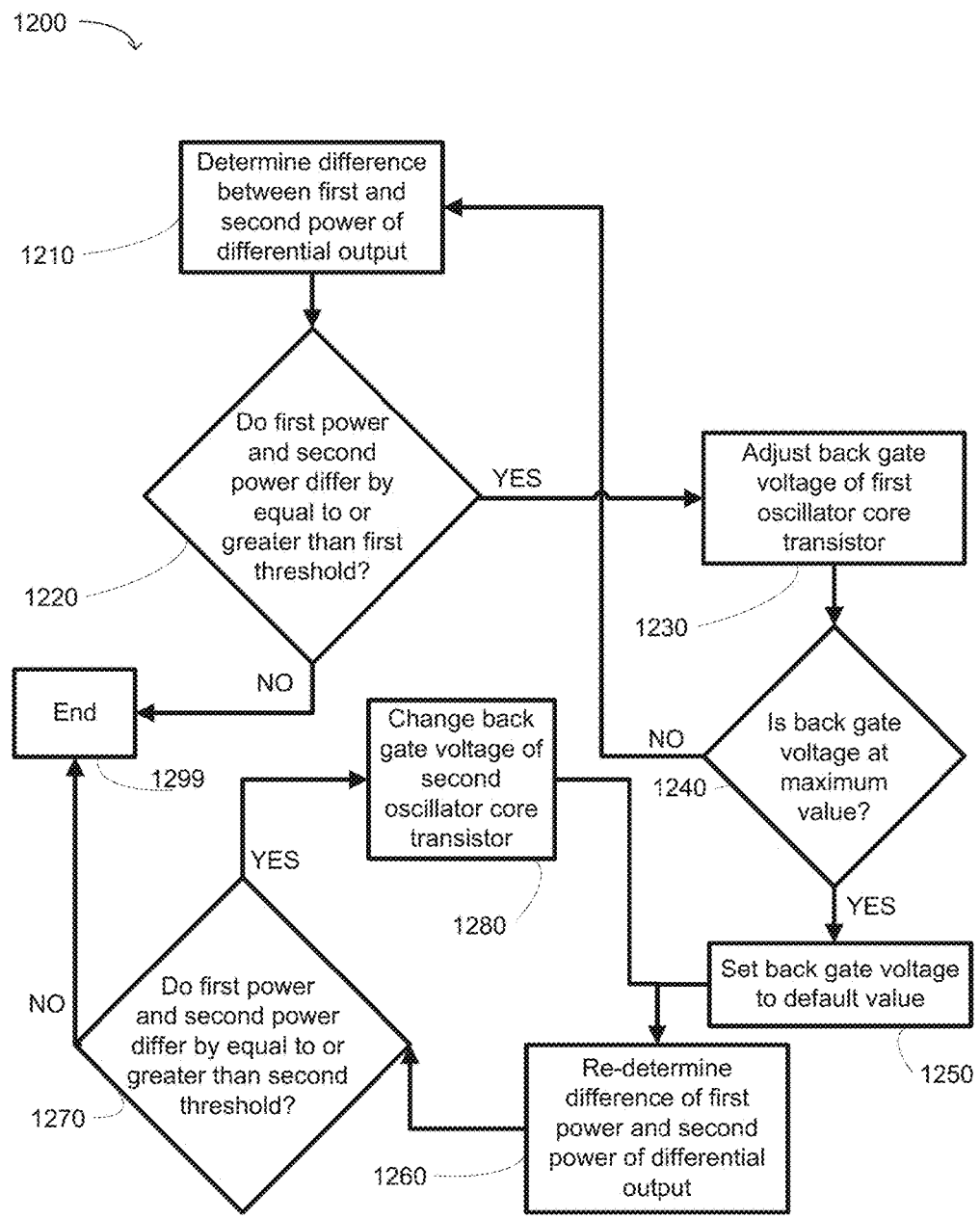
FIG. 12 illustrates a method, in accordance with embodiments herein.

FIG. 12 provides a flowchart of a method 1200, in accordance with embodiments herein. As depicted, the method 1200 comprises determining (at 1210) a difference between a first power of a first component of a differential output of a power amplifier comprising oscillator core transistors, and a second power of a second component of the differential output. The first component may be a P component of the differential output, and the second component may be an M component of the differential output.

In one embodiment, the power amplifier may be the power amplifier 900 depicted in FIG. 9. In one embodiment, the power difference between the components of the differential output may be determined (at 1210) by a power detector, such as power detector 960 depicted in FIG. 9. In another embodiment, the power difference between the components of the differential output may be determined (at 1210) by a back gate voltage control unit, such as back gate voltage control unit 925 depicted in FIG. 9, based on power levels or a power difference detected by e.g. power detector 960.

Although the difference may be determined (at 1210) by measuring the absolute power of the first and second components of the output and subtracting one from the other, in embodiments, the power determination may be relative, meaning only the difference between the first power and the second power is determined directly, and the first power and second power themselves are not determined.

As depicted, the method 1200 then determines (at 1220) whether the first power and the second power differ by equal to or greater than a first threshold. In one embodiment, the first threshold is 0.1 dB. If the first power and the second power do not differ by equal to or greater than the first threshold, the method 1200 exits (at 1299). For convenience, the word "difference" is used herein for a convenience instead of the more mathematically-precise phrasing of "the absolute value of the difference." However, the latter term is intended.

If, on the other hand, the first power and the second power differ by equal to or greater than the first threshold, the method 1200 comprises adjusting (at 1230) a back gate voltage of a first oscillator core transistor.

The method 1200 may further comprise determining (at 1240) if the changed back gate voltage is at a maximum value. If the changed back gate voltage is at less than the maximum value, flow returns to determining (at 1210).

However, if the changed back gate voltage is at the maximum value, the method 1200 may additionally comprise setting (at 1250) the back gate voltage to a default value. The default value may be selected according to the intended use of a device comprising the power amplifier. The method 1200 may also comprise re-determining (at 1260) a difference between the first power and the second power. The method 1200 may then comprise determining (at 1270) whether the re-determined difference between the first power and the second power is equal to or greater than a second threshold. In one embodiment, the second threshold is 0.1 dB. In embodiments, re-determining the power difference may be relative, meaning only the difference between the first power and the second power is re-determined, and not the first power and second power themselves.

If the re-determined difference between the first power and the second power is less than the second threshold, the method 1200 exits (at 1299).

If, instead, the re-determined difference between the first power and the second power is equal to or greater than the second threshold, the method 1200 may further comprise changing (at 1280) the back gate voltage of a second transistor of the oscillator core. Flow may then return to re-determining (at 1260).

By performing the method 1200, imbalances in the power of a differential output of the power amplifier circuit 900 may be corrected, and/or output power of the power amplifier circuit 900 may be increased. These corrections may be performed dynamically or automatically (e.g., without human intervention and at rates, timing, and efficiency that are not capable by a human, but only by a computer).

The method 1200 may be performed by one or more logic circuits, such as a back gate voltage control unit 925 of the power amplifier circuit 900.

The method 1200 may be performed any desired number of times during operation of the device. In one embodiment, the method 1200 is performed prior to each operation of the device for which imbalance correction of differential output signals is desired. For example, if the device is a millimeter-wave radar device, such as device 100, the method 1200 may be performed prior to each power ramping operation.

Figure 13:
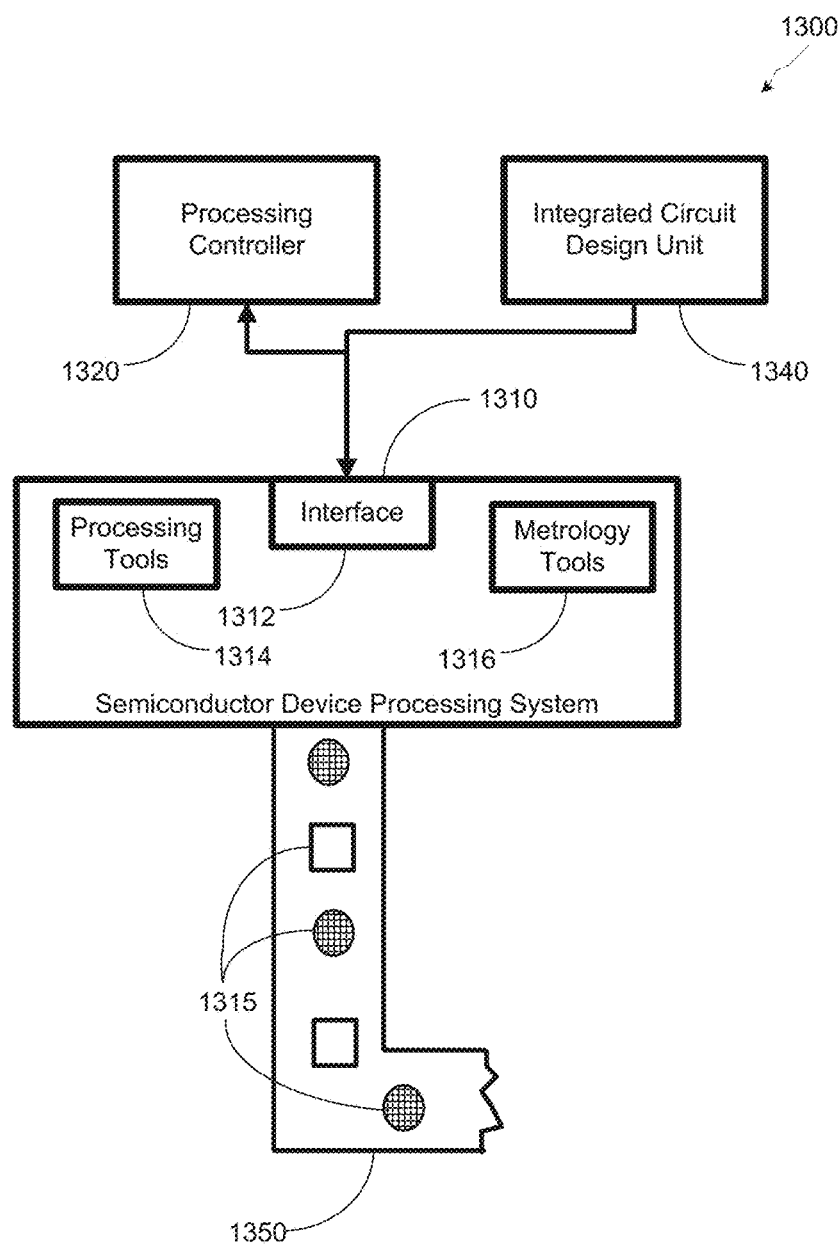
FIG. 13 illustrates a stylized depiction of a system for fabricating a semiconductor device, in accordance with embodiments herein.

Turning now to FIG. 13, a stylized depiction of a system 1300 for fabricating a semiconductor device package comprising a power amplifier circuit, in accordance with embodiments herein, is illustrated. A system 1300 of FIG. 13 may comprise a semiconductor device processing system 1310 and an integrated circuit design unit 1340. The semiconductor device processing system 1310 may manufacture integrated circuit devices based upon one or more designs provided by the integrated circuit design unit 1340.

The semiconductor device processing system 1310 may comprise various processing stations, such as etch process stations, photolithography process stations, CMP process stations, etc. Each of the processing stations may comprise one or more processing tools 1314 and or metrology tools 1316. Feedback based on data from the metrology tools 1316 may be used to modify one or more process parameters used by the processing tools 1314 for performing process steps.

The semiconductor device processing system 1310 may also comprise an interface 1312 that is capable of providing communications between the processing tools 1314, the metrology tools 1316, and a controller, such as the processing controller 1320. One or more of the processing steps performed by the semiconductor device processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 may produce integrated circuits comprising a power amplifier circuit, such as the power amplifier circuit 900 depicted in FIG. 9.

The production of integrated circuits by the semiconductor device processing system 1310 may be based upon the circuit designs provided by the integrated circuit design unit 1340. The semiconductor device processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may implement a plurality of processing steps, e.g., the steps of the method 1200 described above and depicted in FIG. 12.

In some embodiments, the items labeled "1315" may represent individual wafers, and in other embodiments, the items 1315 may represent a group of semiconductor wafers, e.g., a "lot" of semiconductor wafers. The integrated circuit or device 1315 may comprise a transistor, a capacitor, a resistor, a memory cell, a processor, and/or the like.

The integrated circuit design unit 1340 of the system 1300 is capable of providing a circuit design that may be manufactured by the semiconductor device processing system 1310. This may include information regarding whether an input transformer is single-ended or differential; whether an output transformer is single-ended or differential; whether a pair of injection transistors receive a back gate voltage from a same source or from different sources; whether a pair of oscillator core transistors receive a back gate voltage from a same source or from different sources; etc.

The integrated circuit design unit 1340 may be capable of determining the number of devices (e.g., processors, memory devices, etc.) to place in a device package. Based upon such details of the devices, the integrated circuit design unit 1340 may determine specifications of the devices that are to be manufactured. Based upon these specifications, the integrated circuit design unit 1340 may provide data for manufacturing a semiconductor device package described herein.

The system 1300 may be capable of performing analysis and manufacturing of various products involving various technologies. For example, the system 1300 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1300 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A power amplifier, comprising:
a first differential pair of injection transistors comprising a first transistor and a second transistor for receiving a transformer signal;
a first back gate voltage line configured to provide a first back gate voltage to a back gate node of the first transistor;
a second back gate voltage line configured to provide a second back gate voltage to the second transistor;
a second differential pair of oscillator core transistors comprising a third transistor and a fourth transistor and operatively coupled to the first differential pair, wherein the third transistor and the fourth transistor are cross-coupled;
a third back gate voltage line configured to provide a third back gate voltage to the third transistor;
a fourth back gate voltage line configured to provide a fourth back gate voltage to the fourth transistor,
a first back gate voltage source operatively coupled to said first back gate voltage line and configured to provide said first back gate voltage;
a second back gate voltage source operatively coupled to said second back gate voltage line and configured to provide said second back gate voltage;
a third back gate voltage source operatively coupled to said third back gate voltage line and configured to provide said third back gate voltage; and
a fourth back gate voltage source operatively coupled to said fourth back gate voltage line and configured to provide said fourth back gate voltage;
wherein the first back gate voltage, the second back gate voltage, the third back gate voltage, and the fourth back gate voltage are each adjustable.

2. The power amplifier of claim 1, wherein the first back gate voltage source and the second back gate voltage source are configured to perform at least one of increasing the first back gate voltage and the second back gate voltage to reduce a lock-in time of the first differential pair and decreasing the first back gate voltage and the second back gate voltage to reduce power consumption.

3. The power amplifier of claim 1, wherein the third back gate voltage source and the fourth back gate voltage source are configured to perform at least one of increasing the third back gate voltage and the fourth back gate voltage to increase output power and adjusting the third back gate voltage and the fourth back gate voltage to compensate current fluctuation.

4. The power amplifier of claim 1, further comprising an input transformer configured to receive an input signal, wherein the input is at least one of a differential input or a single-ended input.

5. The power amplifier of claim 1, further comprising an output transformer configured to provide an output signal, wherein the output signal is a differential output.

6. The power amplifier of claim 4, further comprising a power detector configured to detect the power on each end of the differential output provided by the output transformer.

7. The power amplifier of claim 1, wherein the first transistor, the second transistor, the third transistor, and the fourth transistor are FDSOI transistors.

8. A method, comprising:
determining a difference between a first power of a first component of a differential output of a power amplifier comprising oscillator core transistors, and a second power of a second component of the differential output;
adjusting a back gate voltage of a first oscillator core transistor, in response to the first power and the second power differing by equal to or greater than a first threshold;
setting the back gate voltage of the first oscillator core transistor to a default value, in response to the back gate voltage being adjusted to a maximum value;
re-determining a difference the first power and the second power, in response to the back gate voltage of the first oscillator core transistor being set to the default value; and
changing a back gate voltage of a second oscillator core transistor, in response to a re-determined difference between the first power and the second power being equal to or greater than a second threshold.

9. The method of claim 8, wherein the first threshold is 0.1 dB.

10. The method of claim 8, wherein the second threshold is 0.1 dB.

11. The method of claim 8, wherein measuring the first power and the second power comprises measuring leakage of the first differential output and the second differential output.

12. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form an input transformer;
form a first differential pair of injection transistors comprising a first transistor and a second transistor;
form a first back gate voltage source configured to provide a first back gate voltage to the first transistor, wherein the first back gate voltage is adjustable;

form a second back gate voltage source configured to provide a second back gate voltage to the second transistor, wherein the second back gate voltage is adjustable;

form a second differential pair of oscillator core transistors comprising a third transistor and a fourth transistor, wherein the third transistor and the fourth transistor are cross-coupled;

form a third back gate voltage source configured to provide a third back gate voltage to the third transistor, wherein the third back gate voltage is adjustable;

form a fourth back gate voltage source configured to provide a fourth back gate voltage to the fourth transistor, wherein the fourth back gate voltage is adjustable; and form an output transformer.

13. The system of claim 12, wherein the semiconductor device processing system is adapted to form a first voltage source to serve as both the first back gate voltage source and the second back gate voltage source, and a second voltage source to serve as both the third back gate voltage source and the fourth back gate voltage source.

14. The system of claim 12, wherein the semiconductor device processing system is adapted to form the input transformer to receive a differential input.

15. The system of claim 12, wherein the semiconductor device processing system is adapted to form the output transformer to provide a differential output.

16. The system of claim 15, wherein the semiconductor device processing system is further adapted to form a power detector configured to detect the power on each end of the differential output provided by the output transformer.

17. The system of claim 16, wherein the semiconductor device processing system is further adapted to form one or more logic elements configured to perform a method comprising measuring a first power of a first end of the differential output and a second power of a second end of the differential output; and changing at least one of the third back gate voltage and the fourth back gate voltage, in response to the measured first power and the measured second power differing by equal to or greater than a first threshold.

18. The system of claim 12, wherein the semiconductor device processing system is adapted to form the first transistor, the second transistor, the third transistor, and the fourth transistor as FDSOI transistors.

* * * * *